US011190170B2

(12) United States Patent
Schaper et al.

(10) Patent No.: US 11,190,170 B2
(45) Date of Patent: Nov. 30, 2021

(54) CIRCUIT ASSEMBLY

(71) Applicant: Phoenix Contact GmbH & Co. KG, Blomberg (DE)

(72) Inventors: Elmar Schaper, Luegde (DE); Markus Rohs, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 16/960,383

(22) PCT Filed: Dec. 18, 2018

(86) PCT No.: PCT/EP2018/085375
§ 371 (c)(1),
(2) Date: Jul. 7, 2020

(87) PCT Pub. No.: WO2019/141461
PCT Pub. Date: Jul. 25, 2019

(65) Prior Publication Data
US 2020/0358429 A1    Nov. 12, 2020

(30) Foreign Application Priority Data

Jan. 17, 2018  (DE) ..................... 10 2018 100 974.7

(51) Int. Cl.
*H03K 3/012* (2006.01)
*H03K 17/567* (2006.01)

(52) U.S. Cl.
CPC ........... *H03K 3/012* (2013.01); *H03K 17/567* (2013.01)

(58) Field of Classification Search
None
See application file for complete search history.

(56) References Cited

U.S. PATENT DOCUMENTS

| 9,702,910 B2* | 7/2017 | Baldridge | .......... H03K 17/0822 |
| 10,845,425 B2* | 11/2020 | Bruhn, Jr. | .............. G01R 31/42 |
| 2002/0093774 A1* | 7/2002 | Chung | ..................... H02P 25/04 361/2 |
| 2008/0164961 A1 | 7/2008 | Premerlani et al. | |
| 2009/0289756 A1* | 11/2009 | Raichle | .................. G07C 5/008 340/2.1 |

(Continued)

FOREIGN PATENT DOCUMENTS

| DE | 693 12 731 T2 | 12/1997 |
| DE | 10201467 A1 | 8/2002 |

(Continued)

*Primary Examiner* — Lincoln D Donovan
*Assistant Examiner* — Khareem E Almo
(74) *Attorney, Agent, or Firm* — Holland & Hart LLP (57) ABSTRACT

A circuit assembly includes a first signal branch connecting a signal connection to an electrical load via a semiconductor switch and a second signal branch connecting the signal connection to the electrical load via a relay. When a sensor detects a polarity change in an electrical signal within a test time interval, a controller may close the semiconductor switch at a first signal time such that electrical energy is supplied to the electrical load, actuate the relay at a second signal time after the semiconductor switch has been closed, and open the semiconductor switch after the relay has been closed such that electrical energy is supplied to the electrical load solely via the second signal branch.

20 Claims, 6 Drawing Sheets

(56) References Cited

U.S. PATENT DOCUMENTS

| | | | | |
|---|---|---|---|---|
| 2011/0090604 A1* | 4/2011 | Butler | ............... | G05F 1/44 |
| | | | | 361/18 |
| 2011/0115460 A1* | 5/2011 | Elliott | ............... | H03K 17/78 |
| | | | | 323/285 |
| 2018/0217658 A1* | 8/2018 | Bruhn, Jr. | ............... | H03K 5/1536 |
| 2019/0165786 A1* | 5/2019 | Shimada | ............... | H04L 25/03343 |
| 2020/0235731 A1* | 7/2020 | Wang | ............... | H03K 17/687 |

FOREIGN PATENT DOCUMENTS

| | | |
|---|---|---|
| JP | 2017-60317 A | 3/2017 |
| WO | WO 2014075742 A1 | 5/2014 |
| WO | WO 2016/142163 A1 | 9/2016 |

\* cited by examiner

CIRCUIT ASSEMBLY

CROSS-REFERENCE

The present application is the U.S. national stage entry of PCT/EP2018/085375, filed 18 Dec. 2018, entitled "CIRCUIT ASSEMBLY," which claims the benefit of German Patent Application No. 10 2018 100 974.7, filed 17 Jan. 2018, entitled "Schaltungsanordnung". Each of these applications is incorporated by reference herein for all purposes.

BACKGROUND

The present disclosure relates to a circuit assembly for supplying an electrical signal to an electrical load.

Electromechanical switches or semiconductor switches can be used to switch an electrical signal, in particular an electrical voltage or an electrical current. An electromechanical switch typically offers the advantage of a lower power loss when switching electrical currents with a high current compared to a semiconductor switch. However, the life of the electromechanical switch can be reduced by contact erosion when switching. A semiconductor switch, however, usually shows hardly any signs of wear depending on the current. A combination of the semiconductor switch with the electromechanical switch can compensate for the respective disadvantages. However, a semiconductor switch cannot disadvantageously be equally suitable for direct currents and for alternating currents.

SUMMARY

It is the object of the present disclosure to provide an efficient circuit assembly for switching an electrical signal.

This object is solved by the features of the independent claims. Advantageous examples are the subject matter of the dependent claims, the description and the accompanying figures.

The present disclosure is based on the finding that the above object can be solved by a circuit assembly which is suitable both for switching AC voltages and for switching DC voltages, wherein electrical currents having a current in a wide range from, for example, 1 mA to 10 A are switchable. The circuit assembly comprises a semiconductor switch and a relay, which are connected in parallel, and a sensor, which is configured to detect the characteristic of a voltage applied to the circuit assembly and a current flowing through the circuit assembly. Furthermore, the circuit assembly comprises a controller which is configured to switch the semiconductor switch and the relay at a signal-specific switching time in each case, so that a power loss in the circuit assembly and wear of the relay are reduced in accordance with the applied voltage or the flowing current.

According to a first aspect, the disclosure relates to a circuit assembly for supplying an electrical signal to an electrical load. The circuit assembly comprises a signal connection to which the electrical signal can be applied, a first signal branch in which a semiconductor switch is arranged, wherein the semiconductor switch is configured to electrically close the first signal branch in a closed state in order to electrically connect the electrical load to the signal connection via the first signal branch, and to interrupt the first signal branch in an open state, and a second signal branch, in which a relay is arranged, wherein the relay is configured to electrically close the second signal branch in order to electrically connect the electrical load to the signal connection via the second signal branch.

Furthermore, the circuit assembly comprises a sensor, which is electrically connected to the signal connection and is configured to test the electrical signal for a polarity change within a test time interval, and a controller, which is configured to determine a first signal time for actuating the semiconductor switch and a second signal time for actuating the relay in the event of a detected polarity change, wherein the first signal time and the second signal time lie in a time interval, which is determined by two consecutive and opposite polarity changes of the electrical signal.

The controller is further configured to close the semiconductor switch at the first signal time after in order to close the first signal branch in order to supply electrical energy to the electric load, and is further configured to actuate the relay at the second signal time after the semiconductor switch has been closed in order to subsequently close the relay. The controller is further configured to open the semiconductor switch after the relay has been closed in order to supply electrical energy to the electrical load solely via the second signal branch.

The semiconductor switch can be a triac, a metal oxide semiconductor field effect transistor (MOSFET), a diode bridge circuit or a transistor, in particular a bipolar transistor with an insulated gate electrode (IGBT). The semiconductor switch can be configured to efficiently conduct a direct current with an effective or maximum voltage in a range from 100 mV to 24 V and with a current in a range from 1 mA to 2 A, or to efficiently conduct a DC voltage with a voltage above 60 V and a current above 6 A. The semiconductor switch can alternatively be configured for AC voltages, wherein the semiconductor switch configured for an AC voltage cannot switch off a DC voltage load. The semiconductor switch is preferably a DC-capable IGBT, the IGBT being able to be protected by a current blocking element, in particular a diode, against the flow of a reverse current through the IGBT.

With suitable signal times for the IGBT and the relay arranged parallel to the IGBT, the circuit assembly can be configured, in particular without modification, to efficiently switch electrical loads in a wide range, for example an electrical load with a DC or an AC voltage of 250 V and a current of 6 A or another electrical load with a DC voltage of 24 V and a current of 1 mA.

The efficiency of the circuit assembly can be determined due to an increased service life of the circuit assembly, freedom from wear when conducting and/or switching electrical currents or switching of electrical voltages, reduced power loss when conducting electrical currents, increased reliability when switching low voltages, for example below 25V and/or when switching currents with low currents, for example below 500 mA.

After the semiconductor switch has been switched, the relay can be switched off and/or de-energized in order to subsequently take over an electrical load from the semiconductor switch when the semiconductor switch opens. As a result, the relay can advantageously have contact spacings which can be smaller than it would be possible if the relay was switched when an electrical current flows through the relay or if an electrical voltage is applied to the relay. The relay can accordingly be smaller and more cost-effective to manufacture. If the relay is switch without any voltage or current, the formation of an arc and/or bouncing can be prevented.

With the sensor, a time profile of a current and/or a voltage can be recorded in order to determine an advantageous switch-on time for the semiconductor switch and/or for the relay.

By closing the relay in a time interval without changing the polarity of the electrical signal, a change and/or reduction in the electrical power that is provided to the electrical load can be prevented.

Furthermore, the first signal switching point in time can form a triggering point in time of the semiconductor switch and the second signal switching point in time can form a triggering point in time for the relay. The respective signal branch can be closed and/or opened by means of the semiconductor switch or relay after the signal switching time, in particular with a switching delay. The switch-on delay of the semiconductor switch can be in a range from 5 ns to 500 ns or higher and a further switch-on delay of the relay can be in a range from 1 µs to 20 ms or higher. Furthermore, the semiconductor switch and/or the relay can each have a switch-off delay which lies in a comparable time range of the respective switch-on delay.

In one example, the controller is configured to determine the second signal switching time in such a way that the second signal branch is closed after a polarity change. For example, the semiconductor switch can close the first signal branch during a first half period and the relay can close the second signal branch in a second half period, which follows the first half period after a polarity change of the electrical signal. For this purpose, the switch-on delay of the relay can also be used to control the relay, for example, before the polarity change, so that the relay closes the second signal branch at the beginning of the second half period.

In one example, the controller is configured to determine a third signal time for closing the first signal branch and a fourth signal time for closing the second signal branch, in the event that there was no polarity change within the test time interval, wherein the second signal branch closes in time after the first signal branch.

This has the advantage that a DC voltage present at the signal connection can also be detected by the control and can be efficiently connected to the electrical load by means of the semiconductor switch and the relay. If no polarity change was detected in the test time interval, the electrical signal present at the signal connection is identified as a DC voltage. The switching of the semiconductor switch and/or the relay can be independent of the electrical signal. For example, switching of the semiconductor switch and subsequent switching of the relay can take place without a time delay after the test time interval. The electrical signal can have zeros and can still be recorded as DC voltage.

In one example, the controller is configured to first close the semiconductor switch to close the first signal branch in order to interrupt an electrical connection between the electrical load and the signal connection, wherein the controller is further configured to open the relay after the semiconductor switch has closed, and wherein the controller is further configured to open the semiconductor switch after the relay has been opened in order to prevent the electrical load from being supplied with electrical energy via the first signal branch and the second signal branch.

An opening sequence of the semiconductor switch and/or of the relay can be implemented as a function of detected polarity changes at the signal connection. At the beginning of the opening sequence, the first signal branch can be opened, and the second signal branch can be closed. The opening sequence for an AC voltage signal can start with the switching of the semiconductor switch at a first opening time, so that the first signal branch is closed. The relay can then be switched at a second opening time, which can be determined by a phase angle of a voltage and/or a current of the electrical signal, so that the second signal branch is opened. The semiconductor switch and the relay can be switched in a positive half-wave of an AC voltage signal. The positive half-wave can be a signal section of the electrical signal which is enclosed by two opposite and consecutive polarity changes.

The second opening time advantageously has a time interval from the next polarity change of the current or the voltage, wherein the time interval can correspond to at least one switch-off delay of the relay. Finally, the semiconductor switch can be switched to open the first signal branch in order to interrupt the current flow between the signal connection and the electrical load. The final switching of the semiconductor switch can also take place within the positive half-wave.

The opening sequence for a DC voltage signal, which has no zero crossings in voltage or current, can begin with the switching of the semiconductor switch, so that the first signal branch is closed. The relay can then be switched at the second opening time. Finally, the semiconductor switch can be switched to open the first signal branch in order to interrupt the current flow between the signal connection and the electrical load.

In one example, the controller is configured to determine the second signal time and/or a fourth signal time as a function of a reaction delay of the relay in order to switch the relay and close the second signal branch in a time interval in which the electrical signal has no polarity change. This achieves the advantage that the second signal branch can be closed at a predetermined point in time, in particular to prevent the first signal branch and the second signal branch from closing with an intervening polarity change of the electrical signal.

In one example, the controller is configured to switch the semiconductor switch and/or the relay with a time delay after a predetermined time interval has elapsed after a polarity change or at a predetermined phase angle of the electrical signal after the polarity change. This has the advantage that the semiconductor switch and/or the relay can be switched as a function of a load state of the circuit assembly. In particular, depending on a specification of the semiconductor switch and/or the relay, the switching of the semiconductor switch and/or the relay to a predetermined signal level of the electrical signal can be advantageous. For example, the relay can switch at a lower current and/or a lower voltage than the semiconductor switch.

In one example, the sensor is configured to detect a signal parameter of the electrical signal and the controller is configured to switch the semiconductor switch when the signal parameter reaches a predetermined limit value in order to close the first signal branch and/or to switch the relay to close the second signal branch.

This has the advantage that the circuit assembly can be operated in an efficient mode of operation in order to reduce energy losses. The signal parameter can in particular be a current or a voltage of the electrical signal. For example, when an upper current limit is reached, the first current path can be opened by switching the semiconductor switch and the second current path can be closed by switching the relay in order to conduct the electrical current with the limited current above or equal to the current limit through the second signal branch. When the electrical current flows with the limited current, the semiconductor switch can have an increased power loss compared to the relay, so that guiding the electrical current with the limited current through the second signal branch can advantageously increase the energy efficiency of the circuit assembly.

Furthermore, when a minimum current value is reached, the first current path can be closed by switching the semiconductor switch and the second current path can be opened by switching the relay in order to conduct the electrical current with the low current level below or equal to the minimum current value through the first signal branch. When the electrical current with the low current level flows, the relay can have a reduced conductivity in comparison to the semiconductor switch, so that conducting the electrical current with the low current level through the first signal branch can advantageously increase the energy efficiency of the circuit assembly.

The predetermined limit value can also be a zero point or a polarity change of the voltage and/or the current, the semiconductor switch and the relay being able to switch, in particular at different times, in order to enable or prevent current flow through the circuit assembly. In particular, the switching of the semiconductor switch and/or the relay can take place in a time interval between two polarity changes or at a zero point of the voltage and/or the current.

In one example, the circuit assembly comprises a diode which is arranged in the first signal branch, the diode being configured to prevent current flow through the first signal branch in a predetermined current flow direction. This has the advantage that a flow of a current against a predetermined direction through the semiconductor switch can be prevented. The semiconductor switch, which is in particular an IGBT, can be configured for DC voltages, so that it can be advantageous to prevent an AC voltage from being applied to the IGBT. With an AC voltage applied to the circuit assembly, the diode can, for example, prevent the respective negative half-waves of the AC voltage from being applied to the IGBT.

The semiconductor switch and the relay can be switched, for example, within a positive half-wave of the AC voltage, so that at the time of a voltage and/or current zero crossing following the positive half-wave, the electrical current can flow completely via the second signal branch. The semiconductor switch can switch in time before the relay and close the first signal branch, so that the relay can subsequently be switched without any current or voltage in order to close the second signal branch. The semiconductor switch can then be switched again to open the first signal branch. The opening of the first signal branch can also take place within the positive half-wave.

The diode can be replaced by a rectification element, which converts an AC voltage into a DC voltage in order to protect the semiconductor switch from the flow of a reverse current and/or the application of a negative voltage.

In one example, the sensor is configured to detect a voltage frequency and/or a current frequency, and the controller is configured to determine the first signal time and the second signal time on the basis of the voltage frequency and/or the current frequency in order to close the first signal branch and the second signal branch within a time interval dependent on the current frequency and/or voltage frequency, in particular half a period.

This has the advantage that the circuit assembly can determine equivalent signal times with respect to a period of the voltage frequency and/or the current frequency. For example, the semiconductor switch and/or the relay can be switched to a predetermined voltage or current amplitude value on the basis of a sinusoidal voltage or current curve, wherein the time interval until the predetermined voltage or current amplitude value is reached can be dependent on the voltage or current frequency.

In one example, the sensor is configured to detect a voltage amplitude and/or a current amplitude and the controller is configured to determine a phase angle based on the voltage amplitude and/or the current amplitude in order to determine the first signal time and/or the second signal time based on the phase angle.

A successful frequency determination can depend on a test rate of the sensor. If a voltage and/or current signal is present at the sensor with a frequency that is greater than a maximum frequency that can be determined without a doubt by the control, the control can detect this, for example, on the basis of fluctuating voltage and/or current amplitude values in order to prevent switching the semiconductor switch and/or the relay. The phase angle can also be used to switch the semiconductor switch and/or the relay to a predetermined current amplitude value and/or a predetermined voltage amplitude value.

In one example, the sensor is configured to periodically or continuously test the electrical signal for a zero crossing of a voltage and/or a current, a type of mains voltage, a voltage amplitude, a current amplitude and/or a bounce and to provide it to the controller as a signal parameter, and wherein the controller is configured to adapt a test interval for the testing of the signal parameter.

This achieves the advantage that the semiconductor switch and/or the relay can be switched with respect to a voltage and/or current zero crossing. For example, the semiconductor switch can open or close the first signal branch simultaneously with a voltage and/or current zero crossing. The relay can then open or close the second signal branch at the semiconductor switch, in particular at a time interval from the semiconductor switch. The controller can be configured to determine a frequency of the voltage applied to the circuit assembly and/or the current flowing through the circuit assembly from a chronological sequence of voltage and/or current zero crossings. The controller can be configured to adapt the first signal time and the second signal time based on the frequency.

In particular, the first signal time and/or the second signal time can each be determined with a predetermined time interval after the detected voltage and/or current zero crossing. When determining the second signal time, the controller can take into account a switch-on delay of the relay in order to switch the relay completely conductive within the first half-wave after the voltage and/or the current zero crossing. The switch-on delay can result from overcoming a distance between two switching contacts of the relay at a limited speed. Furthermore, the switch-on delay can additionally be extended by a bouncing and/or an arc between the switching contacts of the relay.

The first signal time and the second signal time can be identical in time or in succession, wherein the first signal time can be before the second signal time, or vice versa. Furthermore, a time interval between the second signal time and the first signal time can be smaller than the switch-on delay of the relay. For example, the relay can switch at the second signal time, then the semiconductor switch can switch at the first signal time so that the electrical current can flow through the first signal branch and finally after the switch-on delay the relay can close the second current path so that the electrical current can flow through the second signal branch. Finally, the semiconductor switch can be switched to separate the first current path.

By adapting the test interval, in particular reducing the test interval, the advantage can be achieved that the detection of the signal parameter is not under-tested. For example, a detection frequency can be at least twice as high as a change frequency of the signal parameter in order to detect the signal parameter without errors. Furthermore, the detection frequency can correspond to at least one frequency of the voltage and/or current zero crossings. The detection interval can be, for example, 15 ms, so that half a period of a 50 Hz mains voltage, which comprises 10 ms, can still be detected with two voltage zero crossings.

In one example, the controller is configured to record the time profile of the signal parameter and to output a warning signal when a signal parameter limit value is reached by the signal parameter and/or when a signal parameter change limit value is reached by a rate of change of the signal parameter.

This achieves the advantage that the control unit switches the semiconductor switch and/or the relay on basis of the change of the signal parameter efficiently. The semiconductor switch and/or the relay can, for example, be specified for a predetermined voltage and/or current value, so that when the predetermined voltage and/or current values are reached, the control system can prevent electrical current from flowing through the semiconductor switch and/or the relay by opening the respective switch in order to prevent the flow of an overcurrent through the semiconductor switch and/or the relay.

The rate of change of the signal parameter can be used, for example, to detect a strongly increasing voltage and/or a strongly increasing current, in particular before a voltage limit and/or a current limit is reached. In the case of AC voltages, a change in the rate of change of instantaneous values of the voltage and/or the current can be generated by a frequency change and/or by a phase shift of the AC voltage, which can thus be detected by the control system, to adjust the first signal time, the second signal time, the first opening time and/or the second opening time.

In one example, the controller is configured to compare a first signal parameter value recorded in time before the semiconductor switch is switched and/or the relay is switched with a second signal parameter value recorded in time after the semiconductor switch is switched and/or the relay is switched in order to determine a function of the circuit assembly on the basis of the first signal parameter value and the second signal parameter value and to generate a function status signal.

This has the advantage that a correct switch-on or switch-off of the semiconductor switch and/or the relay can be detected by the control. The controller can, for example, detect and compare a current through the semiconductor switch and/or the relay or a voltage that drops across the semiconductor switch or the relay before and after the respective switch is switched. The controller can then compare these recorded variables with reference values stored in the controller or made available to the controller. The reference values can be limit values that describe a limit for the respective detected variable or expected values that include an expected value for the respective variable and a permissible deviation from the expected value.

The functional status signal can be an electrical signal, which can be evaluated by a control device which is arranged remotely and/or which is superordinate to the circuit assembly. Furthermore, the function signal can be a locally output acoustic and/or optical signal.

In one example, the controller is configured to prevent the relay from switching if the signal parameter, in particular a current, does not reach a signal parameter limit value.

This has the advantage that, in particular, small electrical loads with low currents in a range from 1 μA to 1 A can flow via the semiconductor switch. The semiconductor switch can be configured to be able to endure these small electrical powers permanently. The relay is not switched and, accordingly, no current is passed through the second signal branch in order to use the conduction of small electrical loads through the semiconductor switch more efficiently. The relay can have deposits on a switching contact of the relay which cannot be broken through by a small electrical load, and the semiconductor switch can accordingly conduct the small electrical load more efficiently than the relay.

The controller can be configured as a function of the electrical current flowing through the first signal branch and/or the second signal branch to conduct the electrical current through the first signal branch, the second signal branch or in part via the first signal branch and the second signal branch. For this purpose, the controller can prevent the semiconductor switch and/or the relay from switching. As a result, the energy efficiency of the circuit assembly can advantageously be increased.

In one example, the sensor comprises a first voltage measuring device and a second voltage measuring device, the first voltage measuring device being configured to detect an input voltage present at the signal connection and to determine whether the input voltage is a DC voltage or an AC voltage, and the second voltage measuring device being configured, to detect a differential voltage across the first signal branch and/or across the second signal branch in order to detect a switching error of the semiconductor switch and/or the relay.

This has the advantage that a successful switching of the semiconductor switch and/or the relay is detected. The first voltage measuring device can be connected upstream of the first signal branch and/or the second signal branch and the second voltage measuring device can be arranged parallel to the first signal branch and/or the second signal branch. If, after switching the semiconductor switch to close the first signal branch and/or after switching the relay to close the second signal branch, a differential voltage at the semiconductor switch or at the relay drops above a voltage limit for the switched-on state of the semiconductor switch or of the relay, there may be an incomplete or incorrect switching of the semiconductor switch and/or the relay, which may be detectable with the differential voltage.

In one example, the circuit assembly comprises a communication interface, the controller being configured to provide an operating state of the semiconductor switch, a further operating state of the relay and/or a signal parameter via the communication interface.

This achieves the advantage that the circuit assembly is part of a communication network of a plurality of devices, which can have a communication interface. The communication interface can be, for example, a wireless radio frequency identification RFID interface according to the ISO/IEC 14443 or ISO/IEC 18000-3 standard. Furthermore, the communication interface can be a near field communication NFC interface according to the ISO/IEC 14443 or ISO/IEC 18092 standard. Other wireless communication technologies that can be used to communicate with the communication interface include Bluetooth, ZigBee IEEE 802.15.4, Wireless LAN IEEE 802.11, WiMAX IEEE 802.16, 5G, UMTS, Ultra-Wideband UWB, DECT and IrDA. The communication interface can be configured to establish a direct connection with a further communication interface of a further device or to communicate with the further device via a communication network. Furthermore, the communication interface can be a wired interface, in particular an Ethernet interface according to one of the following standards: PROFINET, Modbus-TCP, POWERLINK, EtherCAT or EtherNet/IP.

In one example, the circuit assembly comprises an energy storage, the energy storage being configured to supply the controller with electrical energy and to continuously store electrical energy from an energy source during operation of the circuit assembly, and the controller being configured to detect an interruption of an energy supply to the circuit assembly on the basis of an interruption in the storage of electrical energy in the energy storage and, with the detection of the power supply interruption, to carry out a sequential switch-off of the circuit assembly with closing the semiconductor switch at a first switch-off time, then opening the relay at a second switch-off time and opening the semiconductor switch at a third switch-off time.

This achieves the advantage that if the power supply to the circuit assembly is interrupted, the controller can be supplied with electrical energy temporarily from the energy storage and/or if the power supply to the controller is continuously interrupted, a defined switching state of the semiconductor switch and the relay can be realized. In particular, the defined switching state can be reached before the power supply to the controller via the energy storage is interrupted.

The energy storage can be configured to maintain the functionality of the circuit assembly in the event of an interruption in the energy supply to the circuit assembly by means of a continuous, in particular time-limited energy supply to the circuit assembly. The energy storage can be a rechargeable battery, which in particular provides a DC voltage.

According to a second aspect, the disclosure relates to a method for supplying an electrical signal to an electrical load, with a switching device which comprises a signal connection, a first signal branch, in which a semiconductor switch is arranged, which is configured to electrically connect the electrical load to the signal connection via the first signal branch, a second signal branch, in which a relay is arranged, which is configured to electrically connect the electrical load to the signal connection via the second signal branch, a sensor, which is electrically connected to the signal connection, and a controller, which is configured to switch the semiconductor switch and the relay.

The method includes supplying the electrical signal to the signal connector; Testing the electrical signal for a polarity change within a test interval by the sensor; Determining the first signal time for closing the first signal branch and determining a second signal time for closing the second signal branch by the controller in the event of a detected polarity change; Closing the semiconductor switch at the first signal time by the controller in order to close the first signal branch and to supply electrical energy to the electrical load; Closing the relay after the semiconductor switch has been closed at the second signal time by the controller; and Opening the semiconductor switch after the relay has been closed in order to supply the electrical load with electrical energy only via the second signal branch.

BRIEF DESCRIPTION OF THE DRAWINGS

Further examples are explained with reference to the attached figures. They show.

DETAILED DESCRIPTION

Figure 1:
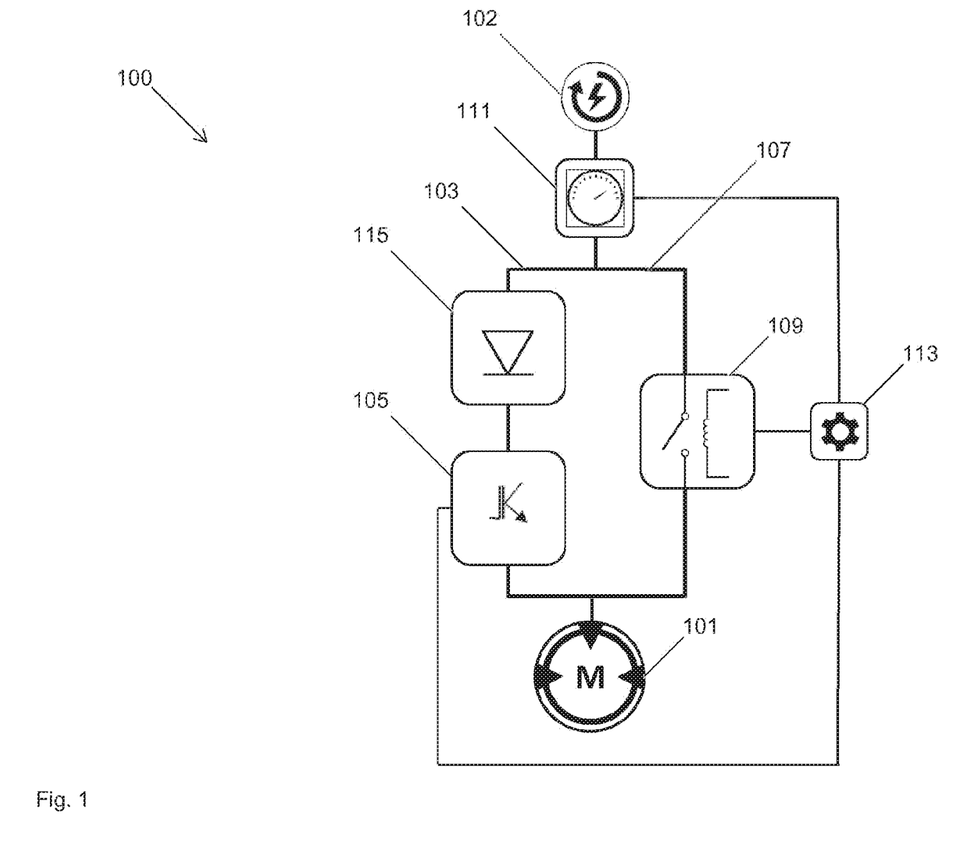
FIG. 1 a circuit assembly in one example.

FIG. 1 shows a schematic illustration of a circuit assembly 100 for supplying an electrical signal to an electrical load 101. The circuit assembly comprises a signal connection 102 to which the electrical signal can be applied, a first signal branch 103 in which a semiconductor switch 105 is arranged and a second signal branch 107 in which a relay 109 is arranged. The semiconductor switch 105 is configured to electrically close the first signal branch 103 in a closed state, in order to electrically connect the electrical load 101 to the signal connection 102 via the first signal branch 103, and to interrupt the first signal branch 103 in an open state. The relay 109 is configured to electrically close the second signal branch 107 in order to electrically connect the electrical load 101 to the signal connection 102 via the second signal branch 107. The circuit assembly 100 further comprises a sensor 111, which is electrically connected to the signal connection 102 and is configured to test the electrical signal for a polarity change within a test time interval.

Furthermore, the circuit assembly 100 comprises a controller 113, which is configured to determine a first signal time for actuating the semiconductor switch 105 and a second signal time for actuating the relay 109 in the event of a detected polarity change, wherein the first signal time and the second signal time lie in a time interval, which is determined by two consecutive and opposite polarity changes of the electrical signal. The controller 113 is further configured to close the semiconductor switch 105 at the first signal time to close the first signal branch 103 in order to supply electrical energy to the electrical load 101, and to actuate the relay 109 at the second signal time after the semiconductor switch 105 has been closed, in order to subsequently close relay 109. The controller 113 is also configured to open the semiconductor switch 105 after the relay 109 has been closed in order to supply electrical energy to the electrical load 101 solely via the second signal branch 107.

A diode 115 is connected upstream of the semiconductor switch 105, the diode 115 being configured to prevent a current flow through the first signal branch 103 in a predetermined current flow direction. The diode 115 can be formed by a rectification element which is configured to convert an AC voltage signal into a DC voltage signal.

Furthermore, the controller 113 is configured, in the event that there was no polarity change within the test time interval, to determine a third signal time for closing the first signal branch 103 and a fourth signal time for closing the second signal branch 107, the second signal branch 107 closes after the first signal branch 103 in time.

The sensor 111 is configured to detect a signal parameter of the electrical signal, and the controller 113 is configured to switch the semiconductor switch 105 when the signal parameter reaches a predetermined limit value in order to close the first signal branch 103 and/or to switch the relay 109 to close the second signal branch 107.

The sensor 111 can detect a voltage frequency, a current frequency, a zero crossing of a voltage and/or a current, a type of mains voltage, a voltage amplitude and/or a current amplitude and to provide them as signal parameters. The controller 113 can be configured to determine a phase angle using a signal parameter or a combination of the aforementioned signal parameters or a time course of a signal parameter in order to determine the first signal time and/or the second signal time using the phase angle. The controller 113 can be configured to determine the time profile of the signal parameter by periodically recording the signal parameter.

The controller 113 is also configured to prevent the relay 109 from switching if the signal parameter, in particular a current, does not reach a signal parameter limit value. When the signal parameter limit value is reached by the signal parameter and/or when a signal parameter change limit value is reached by a rate of change of the signal parameter, the controller 113 can output a warning signal.

The semiconductor switch 105 is configured to open the first signal branch 103 and the relay 109 is configured to open the second signal branch 107, and the controller 113 is configured to switch the semiconductor switch 105 at a first opening time in order to open the first signal branch 103 and switch the relay 109 at a second opening time in order to open the second signal branch 107 and to determine the first opening time and the second opening time on the basis of the signal parameter.

The semiconductor switch 105 is configured to open the first signal branch 103 and the relay 109 is configured to open the second signal branch 107. Accordingly, the controller 113 is configured to switch the semiconductor switch 105 at a first opening time in order to open the first signal branch 103 and to switch the relay 109 at a second opening time to open the second signal branch 107 and to determine the first opening time and the second opening time on the basis of the signal parameter.

The circuit assembly 100 is configured to transport electrical energy from a signal connection 102 to the electrical load 101. Depending on a current signal and/or a voltage signal, which is provided by the signal connection 102, the electrical current can flow temporarily via the first signal branch 103 and/or temporarily via the second signal branch 107.

Figure 2:
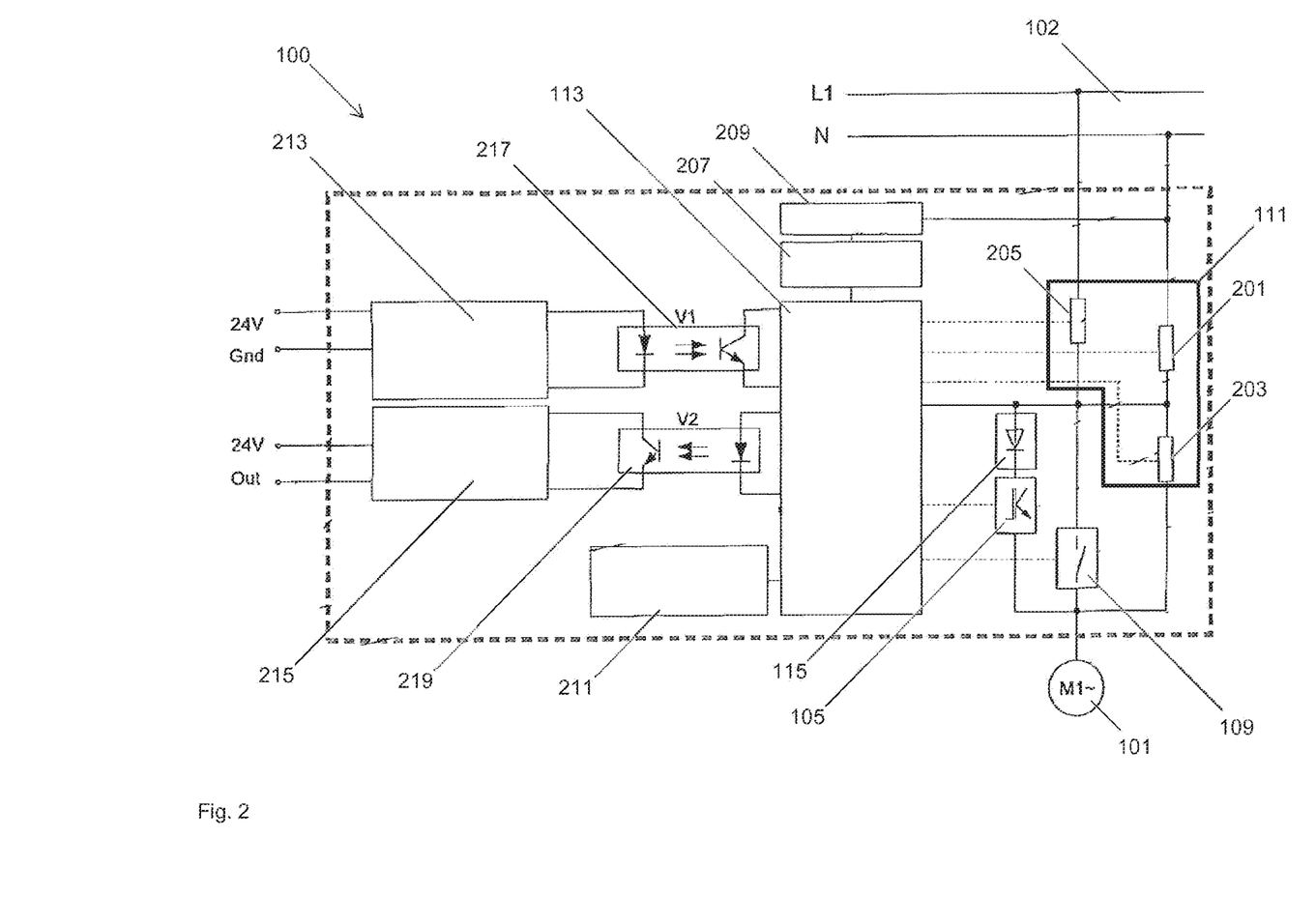
FIG. 2 a circuit assembly in one example.

FIG. 2 shows a schematic illustration shows a schematic illustration of a circuit assembly 100 for supplying an electrical signal to an electrical load 101. The circuit assembly comprises a signal connection 102 to which the electrical signal can be applied, a first signal branch 103 in which a semiconductor switch 105 is arranged and a second signal branch 107 in which a relay 109 is arranged. The semiconductor switch 105 is configured to electrically close the first signal branch 103 in a closed state, in order to electrically connect the electrical load 101 to the signal connection 102 via the first signal branch 103, and to interrupt the first signal branch 103 in an open state. The relay 109 is configured to electrically close the second signal branch 107 in order to electrically connect the electrical load 101 to the signal connection 102 via the second signal branch 107. The circuit assembly 100 further comprises a sensor 111, which is electrically connected to the signal connection 102 and is configured to test the electrical signal for a polarity change within a test time interval.

Furthermore, the circuit assembly 100 comprises a controller 113, which is configured to determine a first signal time for actuating the semiconductor switch 105 and a second signal time for actuating the relay 109 in the event of a detected polarity change, wherein the first signal time and the second signal time lie in a time interval, which is determined by two consecutive and opposite polarity changes of the electrical signal. The controller 113 is further configured to close the semiconductor switch 105 at the first signal time to close the first signal branch 103 in order to supply electrical energy to the electrical load 101, and to actuate the relay 109 at the second signal time after the semiconductor switch 105 has been closed, in order to subsequently close the relay 109. The controller 113 is also configured to open the semiconductor switch 105 after the relay 109 has been closed in order to supply electrical energy to the electrical load 101 solely via the second signal branch 107.

The circuit assembly 100 furthermore comprises an energy storage 207, which is configured to supply electrical energy to the controller 113 and, during the operation of the circuit assembly 100, to continuously store electrical energy of a energy source, and wherein the controller 113 is configured to detect an interruption in the energy supply to the circuit assembly 100 on the basis of an interruption in the storage of electrical energy in the energy storage and, with the detection of the energy supply interruption, to switch off the circuit assembly 100 sequentially when the semiconductor switch 105 is opened at a first switch-off time and opening the relay 109 at a second switch-off time.

An energy source 209 is connected upstream of the energy storage 207 and provides the energy storage 207 with a predetermined voltage and/or a predetermined charging current. The energy source 209 can in particular be a voltage supply which converts a supply network voltage into the predetermined voltage, wherein the supply network voltage can be an AC voltage and the predetermined voltage can be a DC voltage.

The sensor 111 is configured to periodically or continuously test the electrical signal for a zero crossing of a voltage and/or a current, a type of mains voltage, a voltage amplitude, a current amplitude and/or a bouncing, and to provide it to the controller as a signal parameter.

The circuit assembly 100 can have a data memory 211, which is configured to store the detected signal parameter and in particular to store a time profile of the signal parameter. The signal parameter can include a voltage, a current, a current frequency, a voltage frequency, a phase angle, a voltage instantaneous value, a current instantaneous value, a maximum or minimum voltage amplitude, a maximum or minimum current amplitude, a mains voltage type or a combination of the aforementioned variables. The controller 113 is connected to the data memory 211 in order to write data into the data store 211 and/or to read data from the data memory 211.

The circuit assembly 100 further comprises a signal input 213, which is connected to the controller 113 in an electrically isolated manner via an input coupling element 217. The controller 113 can detect a switching signal via the signal input 213 in order to close and/or open the first signal branch 103 by means of the semiconductor switch 105 and/or the second signal branch 107 by means of the relay 109.

The circuit assembly 100 further comprises a signal output 215, which is connected to the controller 113 in an electrically isolated manner via an output coupling element 219. The controller 113 can output a warning signal via the signal output 215 when a signal parameter limit value is reached by the signal parameter and/or when a signal parameter change limit value is reached by a rate of change of the signal parameter.

Via the signal output 215, the controller 113 can also output a status signal relating to a current switching state of the circuit assembly 100, the status signal comprising information on a switching state of the semiconductor switch 105 and/or the relay 109 and/or information relating to the energy supply of the circuit assembly 100.

The electrical isolation between the signal input 213 or the signal output 215 and the controller 113 can be implemented via a potential-free optical coupling of the respective electrical signal. The circuit assembly 100 can be connected via the signal input 213 and the signal output 215 to a two-wire bus system, via which the circuit assembly 100 can be controlled.

The circuit assembly 100 is configured to transport electrical energy from a signal connection 102 to the electrical load 101. Depending on a current signal and/or a voltage signal, which is provided by the signal connection 102, the electrical current can flow temporarily via the first signal branch 103 and/or temporarily via the second signal branch 107.

Figure 3:
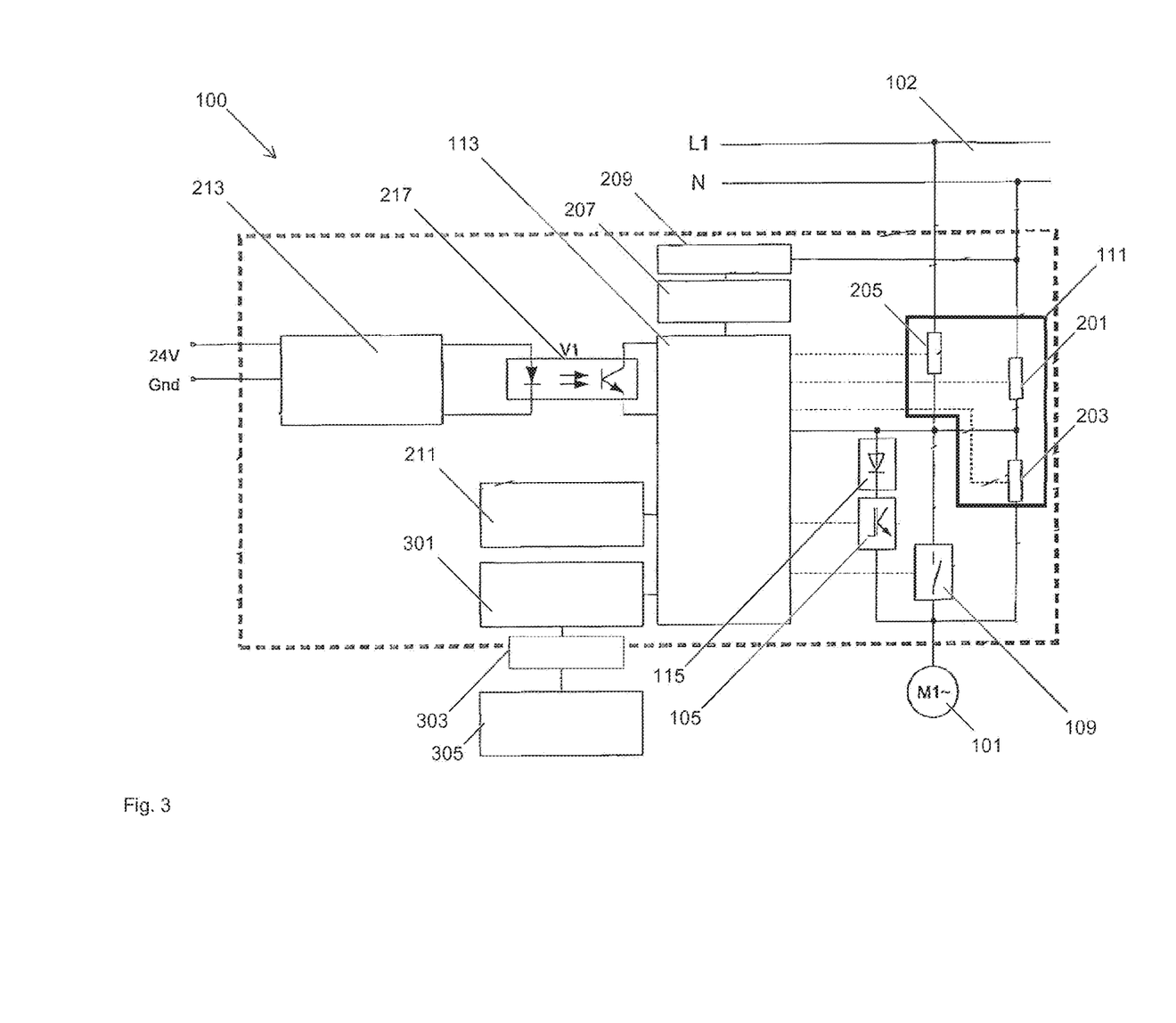
FIG. 3 a circuit assembly in one example.

FIG. 3 shows a schematic illustration shows a schematic illustration of a circuit assembly 100 for supplying an electrical signal to an electrical load 101. The circuit assembly comprises a signal connection 102 to which the electrical signal can be applied, a first signal branch 103 in which a semiconductor switch 105 is arranged and a second signal branch 107 in which a relay 109 is arranged. The semiconductor switch 105 is configured to electrically close the first signal branch 103 in a closed state, in order to electrically connect the electrical load 101 to the signal terminal 102 via the first signal branch 103, and to interrupt the first signal branch 103 in an open state. The relay 109 is configured to electrically close the second signal branch 107 in order to electrically connect the electrical load 101 to the signal connection 102 via the second signal branch 107. The circuit assembly 100 further comprises a sensor 111, which is electrically connected to the signal connection 102 and is configured to test the electrical signal for a polarity change within a test time interval.

Furthermore, the circuit assembly 100 comprises a controller 113, which is configured to determine a first signal time for actuating the semiconductor switch 105 and a second signal time for actuating the relay 109 in the event of a detected polarity change.

The circuit assembly 100 further comprises a signal input 213, which is connected to the controller 113 in an electrically isolated manner via an input coupling element 217. The controller 113 can detect a switching signal via the signal input 213 in order to close and/or open the first signal branch 103 by means of the semiconductor switch 105 and/or the second signal branch 107 by means of the relay 109.

The circuit assembly 100 further comprises a communication interface 301, the controller 113 being configured to provide an operating state of the semiconductor switch 105, a further operating state of the relay 109 and/or the signal parameters via the communication interface 301. The signal output 215 according to the example shown in FIG. 2 can be replaced by the communication interface 301 according to the example shown in FIG. 3. The communication interface 301 can be configured bidirectionally in order to receive communication messages and to send communication messages from the controller 113 to a communication server 305.

The communication interface 301 is connected to a communication network and in particular to a communication server 305 via a network connection 303. The network connection 303 can be used to connect the circuit assembly 100 to a communication network, in particular to a wired Ethernet network or to a wireless LAN or mobile radio network. The controller 113 can be configured to transmit information relating to an electrical load, which is applied to the first signal branch 103 and/or the second signal branch 107, to the communication server 305 by means of the communication interface 301. Accordingly, the communication server 305 can evaluate this information, for example in order to initiate a maintenance measure or a shutdown of the circuit assembly 100.

Figure 4:
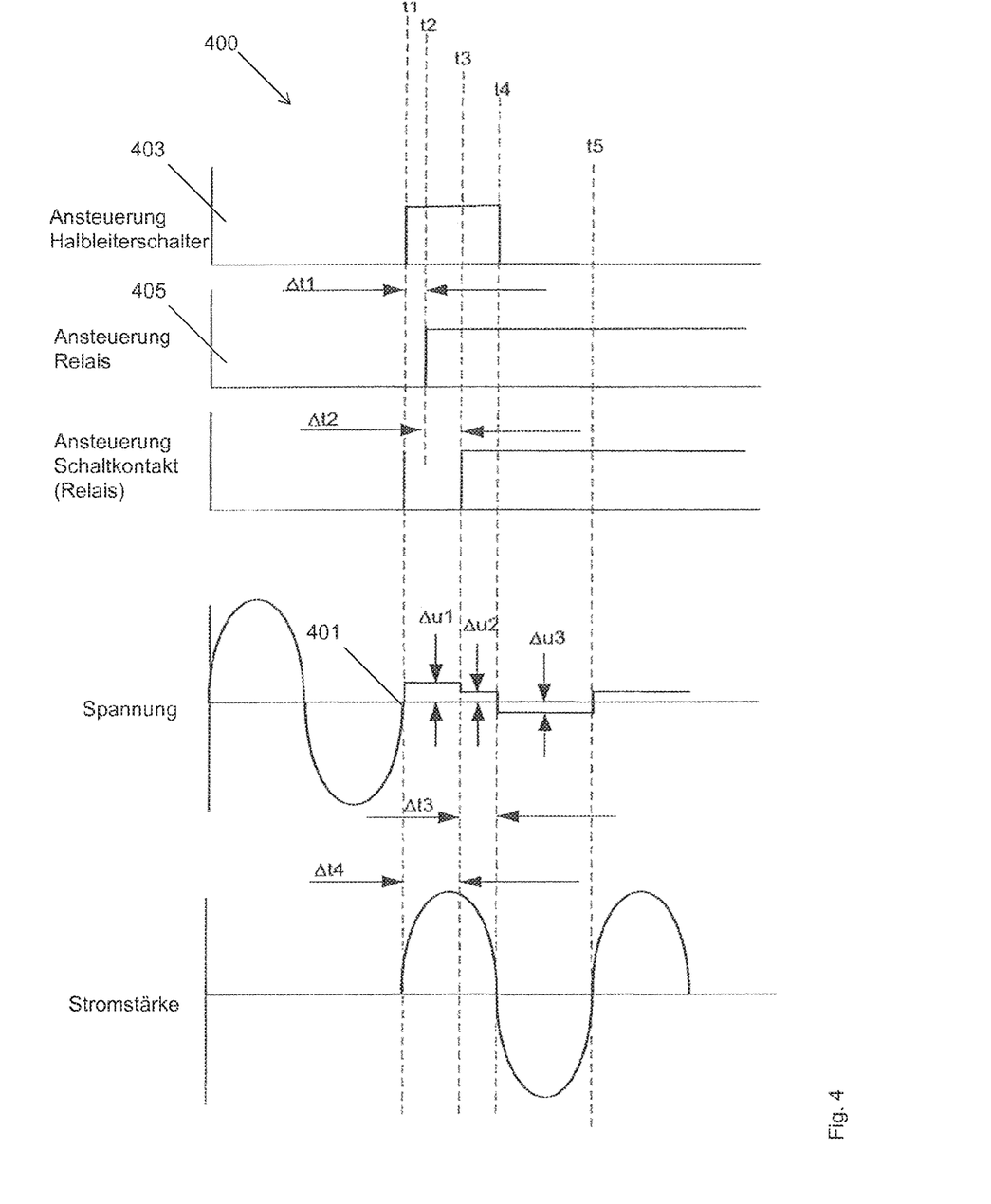
FIG. 4 a switch-on sequence of the circuit assembly in one example.

FIG. 4 shows a schematic illustration of a switch-on sequence 400 of the circuit assembly in the case of an AC voltage signal. The switch-on sequence 400 begins at a first time t1 with a polarity change 401 of the voltage from a negative voltage amplitude to a positive voltage amplitude. At the first time t1, the semiconductor switch is switched on with a control signal 403. The semiconductor switch can have a slight switch-on delay, for example in a range from 5 ns to 500 ns, so that the first signal branch is closed approximately at the first time t1 and an electrical signal can be applied to the electrical load via the first signal branch.

After a first time interval $\Delta t1$ has elapsed, the relay is driven at a second time t2 with a further control signal 405 in order to switch the relay at a third time t3. During the first time interval $\Delta t1$, the voltage can correspond to a, in particular constant, first differential voltage value $\Delta u1$. The current can have a sinusoidal course during the first time interval $\Delta t1$ corresponding to the frequency of the AC voltage applied to the circuit assembly.

The relay can have an electromechanical switching contact which has a switch-on delay which corresponds to the second time interval $\Delta t2$, so that the relay closes the second signal branch at a third time t3. During the switch-on delay, the voltage corresponds to a, in particular constant, second differential voltage value $\Delta u2$. The second differential voltage value $\Delta u2$ is smaller than the first differential voltage value $\Delta u1$. During the switch-on delay, the current has a sinusoidal curve corresponding to the frequency of the AC voltage applied to the circuit assembly.

After a fourth time interval $\Delta t4$, both the first signal branch is closed by means of the semiconductor switch and the second signal branch is closed by means of the relay. The fourth time interval $\Delta t4$ can correspond to a time which the circuit assembly requires from driving the semiconductor switch until the relay closes and thus results in a total switch-on time for the circuit assembly. Subsequently, after the third time interval $\Delta t3$ has elapsed, the semiconductor switch is still opened, which means that the switch-on sequence 400 of the circuit assembly has ended.

During a third time interval $\Delta t3$, the first signal branch is closed by means of the semiconductor switch and the second signal branch is closed by means of the relay, so that an electrical signal can be transmitted to the electrical load via both signal branches.

At a fourth time t4, the control signal 403 can be switched off, so that the semiconductor switch opens the first signal branch. Furthermore, the voltage at the fourth time t4 has a polarity change from a positive voltage amplitude to a negative voltage amplitude. After the fourth time t4, the voltage corresponds to a third differential voltage value $\Delta u3$, which in particular can have the same magnitude as the second differential voltage value $\Delta u2$ but is negative due to the polarity change in the voltage. The switch-on sequence 400 of the circuit assembly is completed at the fourth time t4.

At a fifth time t5, there is a renewed polarity change in accordance with the frequency of the AC voltage applied to the circuit assembly. In the further course, the second signal branch is closed by means of the relay in order to supply the electrical signal to the electrical load via the second signal branch.

Figure 5:
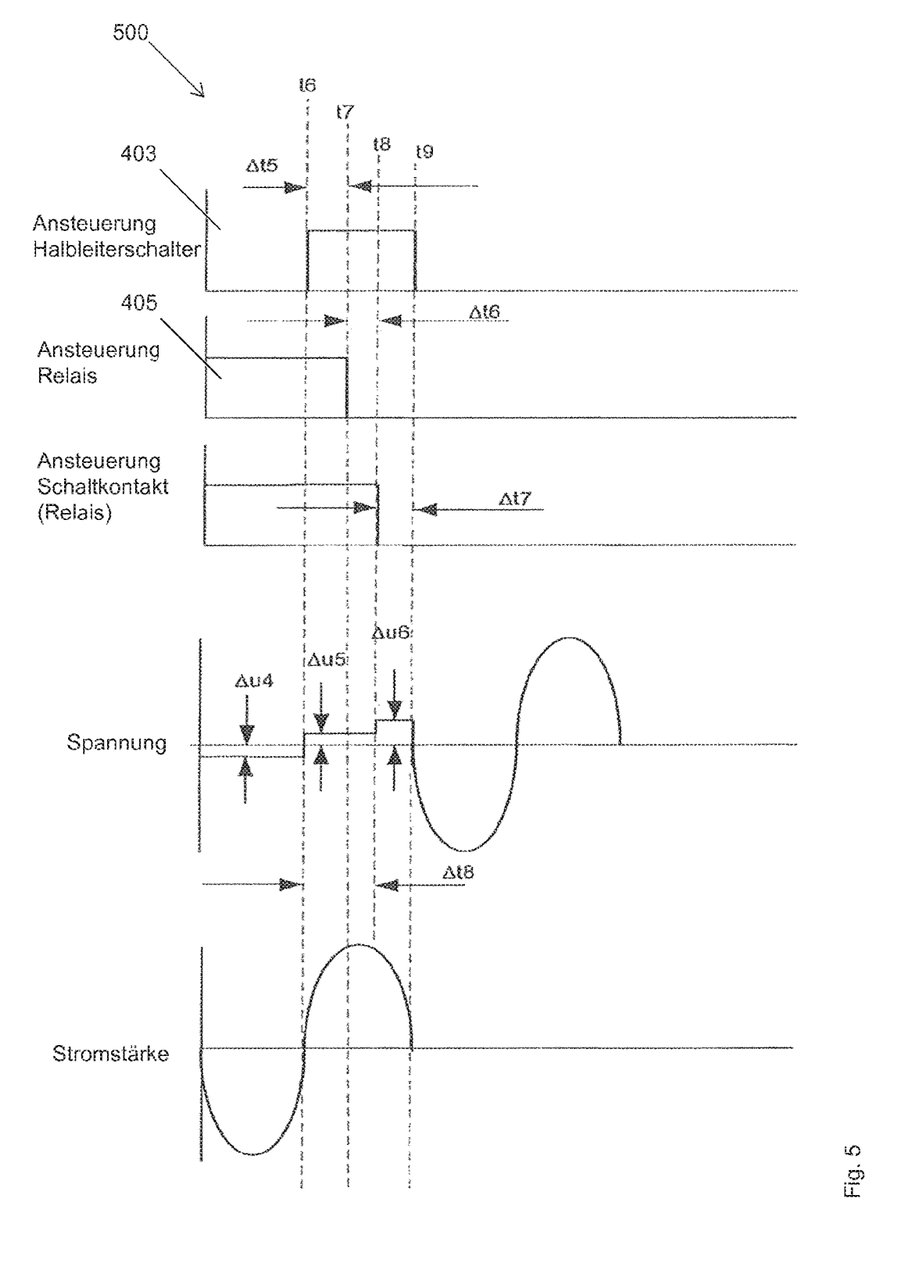
FIG. 5 a switch-off sequence of the circuit assembly in one example.

FIG. 5 shows a schematic illustration of a switch-off sequence 500 of the circuit assembly in the case of an AC voltage signal. The switch-off sequence 500 begins at a sixth time t6 with a polarity change 501 of the voltage from a negative fourth voltage difference value Δu4 to a positive fifth voltage difference value Δu5. At the sixth time t6, the semiconductor switch is switched on with a drive signal 403. The semiconductor switch can have a slight switch-on delay, for example in a range from 5 ns to 500 ns, so that the first signal branch is closed approximately at the sixth time t6 and an electrical signal can be applied to the electrical load via the first signal branch.

After a fifth time interval Δt5 has elapsed, the activation of the relay is prevented when the activation signal 405 is switched off in order to activate the relay at a seventh time t7. During the fifth time interval Δt5, the voltage corresponds to a, in particular constant, fifth differential voltage value Δu5. During the fifth time interval Δt5, the current has a sinusoidal curve corresponding to the frequency of the AC voltage applied to the circuit assembly.

The relay can have a switch-off delay which corresponds to the sixth time interval Δt6, so that after the control signal 405 has been switched off, the relay opens the second signal branch at an eighth time t8. During the switch-off delay, the voltage corresponds to the differential voltage value Δu5. During the switch-off delay, the current has a sinusoidal curve corresponding to the frequency of the AC voltage applied to the circuit assembly. At the eighth time t8, the first signal branch is closed and the electrical load can be supplied with an electrical signal via the first signal branch.

During a seventh time interval Δt7, the first signal branch is closed and the second signal branch is opened, so that an electrical signal can be applied to the electrical load via the first signal branch and not via the second signal branch. Furthermore, the voltage corresponds to a, in particular constant, sixth differential voltage value Δu6 during the seventh time interval Δt7. The sixth differential voltage value Δu6 has a larger amount than the fifth differential voltage value Δu5.

After an eighth time interval Δt8, the first signal branch is closed by means of the semiconductor switch and the second signal branch is opened by means of the relay. The eighth time interval Δt8 can correspond to a time which the circuit assembly requires from actuating the semiconductor switch until the relay opens.

At a ninth time t9, there is a renewed polarity change corresponding to the frequency of the AC voltage applied to the circuit assembly. Furthermore, activation of the semiconductor switch is ended at the ninth time t9, so that the first signal branch is opened. Accordingly, the electrical load is prevented from being supplied with an electrical signal via the first signal branch and/or the second signal branch.

Figure 6:
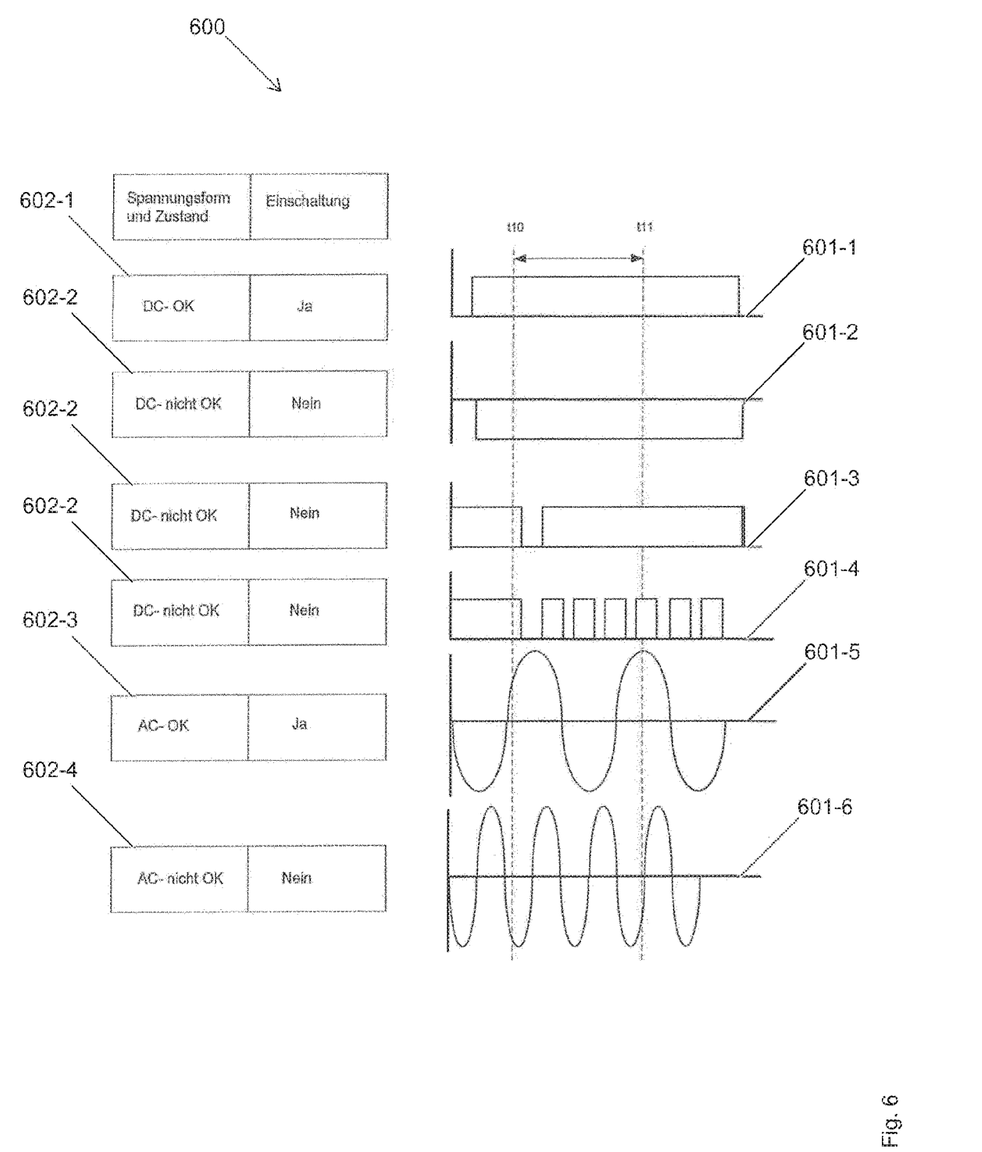
FIG. 6 a plurality of scanning results in one example.

FIG. 6 shows a schematic illustration of a plurality of scanning results 600 of the sensor in one example with respect to different electrical signals. The sensor is configured to detect changes in polarity within a test interval. The test interval is limited by a tenth time t10 and an eleventh t11.

In the test interval no polarity changes of the electrical signal 601-1 occurs. The sensor can be configured to provide the controller with a Boolean status signal 602-1 (DC-OK), which indicates whether the electrical signal 601-1 has been detected as a DC voltage. With the status signal 602-1, the sensor indicates that the electrical signal 601-1 is a DC voltage.

Another electrical signal 601-2 has no polarity changes in the test interval. The sensor can be configured to provide the controller with a further Boolean status signal 602-2 (DC not OK), which indicates whether the electrical signal 601-2 has been detected as a DC voltage. With the status signal 602-2, the sensor indicates that the electrical signal 601-2 is a DC voltage.

Another electrical signal 601-3 has zeros in the testing interval, but no polarity changes. Accordingly, the sensor indicates with the status signal 602-2 that the electrical signal 601-3 is a DC voltage.

Another electrical signal 601-4 has zeros in the testing interval, but no polarity changes. Accordingly, the sensor indicates with the status signal 602-2 that the electrical signal 601-4 is a DC voltage.

Another electrical signal 601-5 shows polarity changes in the test interval. In particular, the electrical signal 601-5 is a sinusoidal AC voltage with a constant frequency. The sensor can be configured to provide the controller with a further Boolean status signal 602-3 (AC-OK), which indicates whether the electrical signal 601-5 has been detected as an AC voltage. Accordingly, the sensor indicates with the status signal 602-3 that the electrical signal 601-5 is an AC voltage.

Another electrical signal 601-6 exhibits polarity changes in the testing interval. In particular, the electrical signal 601-6 is a sinusoidal AC voltage with a constant frequency. The sensor can be configured to provide the controller with a further Boolean status signal 602-4 (AC-not OK), which indicates whether the electrical signal 601-6 has been detected as an AC voltage. Accordingly, the sensor indicates with the status signal 602-4 that the electrical signal 601-6 is an AC voltage.

In one example, the circuit assembly is configured to process the electrical load using one of the electrical signals 601-1 to 601-6, the controller being configured to process the Boolean status signals 602-1 to 602-4 and using at least one of the status signals 602-1 to 602-4 to allow or prevent the electrical load from being exposed to an electrical signal.

REFERENCE SYMBOL LIST 100 circuit assembly
101 electrical load
102 signal connection
103 first signal branch
105 semiconductor switches
107 second signal branch
109 relay
111 sensor
113 control
115 diode
201 first voltage measuring device
203 second voltage measuring device
205 amperemeter
207 energy storage
209 energy source
211 data memory
213 signal input
215 signal output
217 input coupling element
219 output coupling element
301 communication interface
303 network connection
305 communication server
400 switch-on sequence
401 polarity change
403 control signal
405 control signal 500 shutdown sequence
600 test results
601-1 electrical signal
601-2 electrical signal
601-3 electrical signal
601-4 electrical signal
601-5 electrical signal
601-6 electrical signal
602-1 Boolean status signal
602-2 Boolean status signal
602-3 Boolean status signal
602-4 Boolean status signal
t1 first time
t2 second time
t3 third time
t4 fourth time
t5 fifth time
t6 sixth time
t7 seventh time
t8 eighth time
t9 ninth time
t10 tenth time
t11 eleventh time
Δt1 first time interval
Δt2 first time interval
Δt3 first time interval
Δt4 first time interval
Δt5 first time interval
Δt6 first time interval
Δt7 first time interval
Δt8 first time interval
Δu1 first differential voltage value
Δu2 second differential voltage value
Δu3 third differential voltage value
Δu4 fourth differential voltage value
Δu5 fifth differential voltage value
Δu6 sixth differential voltage value

What is claimed is:

1. A circuit assembly for supplying an electrical signal to an electrical load, comprising:
a signal connection configured to receive the electrical signal;
a first signal branch comprising a semiconductor switch, wherein the semiconductor switch is configured to electrically close the first signal branch in a closed state such that the electrical load is electrically connected to the signal connection via the first signal branch, and wherein the semiconductor switch is further configured to interrupt the first signal branch in an open state;
a second signal branch comprising a relay, wherein the relay is configured to electrically close the second signal branch such that the electrical load is electrically connected to the signal connection via the second signal branch;
a sensor electrically connected to the signal connection and configured to test the electrical signal for a polarity change within a test time interval; and
a controller configured to determine a first signal time for actuating the semiconductor switch and a second signal time for actuating the relay in response to a detected polarity change, wherein the first signal time and the second signal time lie in a time interval based on two consecutive and opposite polarity changes of the electrical signal,
wherein the controller is further configured to close the semiconductor switch at the first signal time such that the first signal branch is closed and electrical energy is supplied to the electrical load,
wherein the controller is further configured to actuate the relay at the second signal time after the semiconductor switch has been closed such that the relay is closed subsequent to the semiconductor switch, and wherein the controller is also configured to open the semiconductor switch after the relay has been closed such that electrical energy is supplied to the electrical load solely via the second signal branch, and
wherein the controller is configured to determine the second signal time as a function of a reaction delay of the relay in order to switch the relay and close the second signal branch in a time interval in which there is no polarity change.

2. The circuit assembly according to claim 1, wherein the controller is configured to determine a third signal time for closing the first signal branch and a fourth signal time for closing the second signal branch in response to an absence of polarity change within the test time interval, wherein the second signal branch closes based on the fourth signal time after the first signal branch closes based on the third signal time.

3. The circuit assembly according to claim 1, wherein the controller is configured to close the semiconductor switch to close the first signal branch such that an electrical connection between the electrical load and the signal connection is interrupted, wherein the controller is further configured to open the relay after the semiconductor switch has been closed such that the electrical load is prevented from being supplied with electrical energy via the first signal branch and the second signal branch.

4. The circuit assembly according to claim 1, wherein the controller is configured to determine a fourth signal time as a function of the reaction delay of the relay in order to switch the relay and to close the second signal branch in the time interval in which there is no polarity change.

5. The circuit assembly according to claim 1, wherein the controller is configured to switch the semiconductor switch or the relay with a time delay after a set time interval has elapsed after a polarity change or at a set phase angle of the electrical signal after the polarity change.

6. The circuit assembly according to claim 1, wherein the sensor is configured to detect a signal parameter of the electrical signal, and wherein the controller is configured to switch the semiconductor switch when the signal parameter reaches a threshold limit value in order to close the first signal branch or to switch the relay to close the second signal branch.

7. The circuit assembly according to claim 1, further comprising a diode arranged in the first signal branch, the diode being configured to prevent a current flow through the first signal branch in a set current flow direction.

8. The circuit assembly according to claim 1, wherein the sensor is configured to detect a voltage frequency or a current frequency and the controller is configured to determine the first signal time and the second signal time on the basis of the voltage frequency or current frequency such that the first signal branch and the second signal branch are closed within a time interval dependent on the current frequency or voltage frequency.

9. The circuit assembly according to claim 1, wherein the sensor is configured to detect a voltage amplitude or a current amplitude and the controller is configured to determine a phase angle based on the voltage amplitude or the current amplitude, wherein determining the first signal time or the second signal time is based on the phase angle.

10. The circuit assembly according to claim 1, wherein the sensor is configured to continuously or periodically test the electrical signal for a signal parameter comprising one or more of: a zero crossing of a voltage or a current, a type of mains voltage, a voltage amplitude, a current amplitude, or a bouncing; and wherein the sensor is further configured to provide the signal parameter to the controller; and wherein the controller is configured to adapt a test interval of the testing by the sensor for the signal parameter.

11. The circuit assembly according to claim 10, wherein the controller is configured to record a time profile of the signal parameter and to output a warning signal when a signal parameter limit value is reached by the signal parameter or when a signal parameter change limit value is reached by a rate of change of the signal parameter.

12. The circuit assembly according to claim 10, wherein the controller is configured to compare a first signal parameter value recorded in time before the semiconductor switch is switched or the relay is switched with a second signal parameter value recorded in time after the semiconductor switch is switched or the relay is switched to determine a function of the circuit assembly on the basis of the first signal parameter value and the second signal parameter value and to generate a function status signal.

13. The circuit assembly according to claim 10, wherein the controller is configured to prevent the relay from switching, if the signal parameter does not reach a signal parameter limit value.

14. The circuit assembly according to claim 1, wherein the sensor comprises a first voltage measuring device and a second voltage measuring device, and wherein the first voltage measuring device is configured to detect an input voltage present at the signal connection and to determine whether the input voltage is a DC voltage or an AC voltage, and wherein the second voltage measuring device is configured to detect a differential voltage across the first signal branch or across the second signal branch to detect a switching error of the semiconductor switch or the relay.

15. The circuit assembly according to claim 1, comprising a communication interface, wherein the controller is configured to provide via the communication interface one or more of: a first operating state of the semiconductor switch, a second operating state of the relay, or a signal parameter.

16. The circuit assembly according to claim 1, comprising an energy storage wherein the energy storage is configured to supply the controller with electrical energy and to continuously store electrical energy from an energy source during operation of the circuit assembly, wherein the controller is configured to detect an interruption of an energy supply to the circuit assembly based on an interruption in the storage of electrical energy in the energy storage and, in response to the detection of the interruption in the energy supply, to carry out a sequential switch-off of the circuit assembly by opening the semiconductor switch at a first switch-off time and opening the relay at a second switch-off time.

17. A method for supplying an electrical signal to an electrical load with a switching device, comprising:
providing the switching device, wherein the switching device comprises a signal connection, a first signal branch comprising a semiconductor switch configured to electrically connect the electrical load to the signal connection via the first signal branch, a second signal branch comprising a relay configured to electrically connect the electrical load to the signal connection via the second signal branch, a sensor electrically connected to the signal connection, and a controller configured to switch the semiconductor switch and the relay;
supplying the electrical signal to the signal connection;
testing the electrical signal for a polarity change within a test interval by the sensor;
determining a first signal time for closing the first signal branch and a second signal time for closing the second signal branch by the controller in the event of a detected polarity change;
closing the semiconductor switch at the first signal time by the controller such that the first signal branch is closed and electrical energy is supplied to the electrical load;
closing the relay after the semiconductor switch has been closed at the second signal time by the controller;
opening the semiconductor switch after the relay has been closed in order to supply the electrical load with electrical energy only via the second signal branch;
determining the second signal time as a function of a reaction delay of the relay in order to switch the relay and close the second signal branch in a time interval in which there is no polarity change.

18. The method of claim 17, further comprising:
determining a third signal time for closing the first signal branch and a fourth signal time for closing the second signal branch in response to an absence of polarity change within the test time interval, wherein the second signal branch closes based on the fourth signal time after the first signal branch closes based on the third signal time.

19. The method of claim 17, further comprising:
closing the semiconductor switch to close the first signal branch such that an electrical connection between the electrical load and the signal connection is interrupted; and
opening the relay after the semiconductor switch has been closed such that the electrical load is prevented from being supplied with electrical energy via the first signal branch and the second signal branch.

20. The circuit assembly according to claim 8, wherein the time interval dependent on the current frequency or voltage frequency comprises half a period of the current frequency.

* * * * *